(12) United States Patent
Ogawa

(10) Patent No.: US 7,126,522 B2
(45) Date of Patent: Oct. 24, 2006

(54) APPARATUS AND METHOD OF ANALOG-TO-DIGITAL CONVERSION

(75) Inventor: Makoto Ogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/090,192

(22) Filed: Mar. 28, 2005

(65) Prior Publication Data

US 2005/0219103 A1     Oct. 6, 2005

(30) Foreign Application Priority Data

Mar. 26, 2004   (JP) .............................. 2004-092519

(51) Int. Cl.
  *H03M 1/12* (2006.01)
(52) U.S. Cl. ....................... 341/155; 341/141
(58) Field of Classification Search ................ 341/141, 341/155
  See application file for complete search history.

(56) References Cited

U.S. PATENT DOCUMENTS

| | | | | |
|---|---|---|---|---|
| 4,654,632 A | * | 3/1987 | Yoshida et al. ............. | 341/141 |
| 5,172,116 A | * | 12/1992 | Noma ......................... | 341/141 |
| 5,212,483 A | * | 5/1993 | Wakimoto ................... | 341/141 |
| 5,291,197 A | * | 3/1994 | Abe ............................ | 341/141 |
| 5,541,601 A | * | 7/1996 | Goto et al. .................. | 341/141 |
| 5,675,337 A | * | 10/1997 | Moriyama ................... | 341/141 |
| 5,760,721 A | * | 6/1998 | Inoue ......................... | 341/141 |

FOREIGN PATENT DOCUMENTS

JP          4-88723          3/1992

* cited by examiner

*Primary Examiner*—Rexford Barnie
*Assistant Examiner*—Khai Nguyen
(74) *Attorney, Agent, or Firm*—Young & Thompson

(57) ABSTRACT

An analog-to-digital conversion apparatus includes a register group, a selecting section and an A/D conversion section. The register group has a plurality of registers holding a plurality of channel specification data, respectively. The selecting section is connected with a plurality of analog channels, and sequentially selects the plurality of analog channels for analog-to-digital (A/D) conversion continuously without any idling time based on the plurality of channel specification data held by the plurality of registers. The A/D conversion section carries out the A/D conversion of an analog signal on each of the analog channels selected by the selecting section into a digital signal.

20 Claims, 8 Drawing Sheets

Fig. 2 PRIOR ART

```
              bit3 bit2 bit1 bit0
CHANNEL      ┌────┬────┬────┬────┐
SPECIFICATION│ 0  │ 0  │ 1  │ 1  │ ←SPECIFY CHANNEL 3
DATA         └────┴────┴────┴────┘
```

Fig. 3 PRIOR ART

```
              bit7 bit6 bit5 bit4 bit3 bit2 bit1 bit0
CHANNEL      ┌────┬────┬────┬────┬────┬────┬────┬────┐
SPECIFICATION│ 0  │ 1  │ 1  │ 1  │ 0  │ 0  │ 1  │ 1  │ ←SPECIFY
DATA         └────┴────┴────┴────┴────┴────┴────┴────┘   CHANNELS
                    END CHANNEL         START CHANNEL     3 TO 7
```

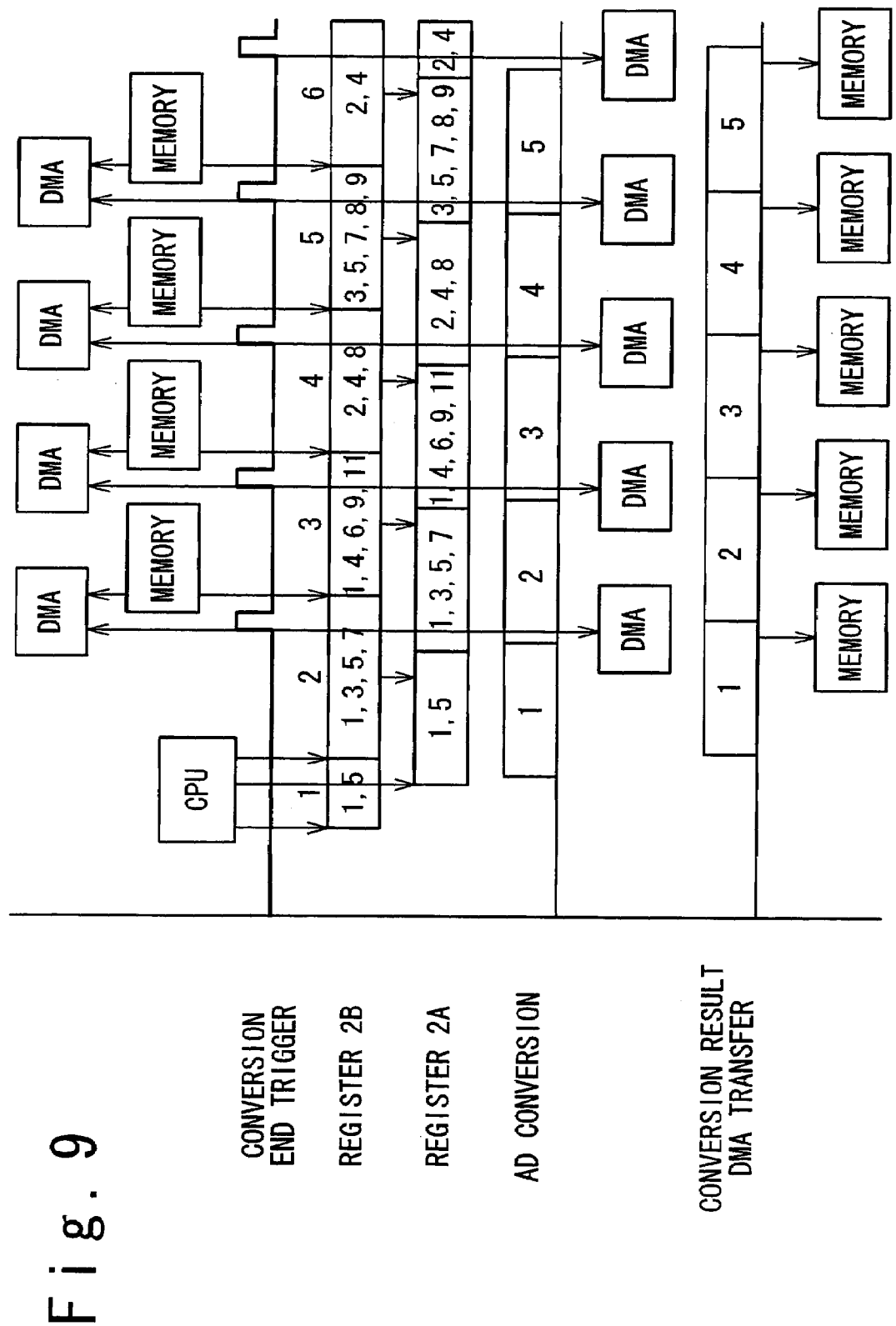

APPARATUS AND METHOD OF ANALOG-TO-DIGITAL CONVERSION

BACKGROUND OF THE INVENTION

1. Field of the Invention

The present invention relates to an analog-to-digital conversion apparatus and a method of analog-to-digital conversion

2. Description of the Related Art

There is a case that a plurality of analog signals needs to be converted into digital signals. In such a case, it is not economically efficient to provide an analog-to-digital (A/D) conversion apparatus for each analog signal. Therefore, an A/D converter has been proposed, in which an A/D converter is provided for a plurality of analog signals and the A/D conversion can be carried out while switching the analog signals.

A conventional A/D conversion apparatus is disclosed in Japanese Laid Open Patent Application (JP-A-Heisei 4-88723). FIG. 1 shows a configuration of the conventional A/D conversion apparatus. Referring to FIG. 1, the conventional A/D conversion apparatus includes a channel register 52, a multiplexer 54, an A/D converter 56, a result storage buffer 58, a CPU 60, a bus 62, and a control unit 70. The multiplexer 54 selects one of a plurality of analog input terminals in response to an input terminal specification signal from the channel register 52. The A/D converter 56 converts an analog signal on the analog input terminal selected by the multiplexer 54, into a digital signal. The conversion result is stored in the result storage buffer 58. The control unit 60 outputs the input terminal specification signal to the multiplexer 54 based on an optionally specified order of the A/D conversion.

This conventional A/D conversion apparatus has a select mode and a scan mode. For instance, as shown in FIG. 2, when a channel specification data is stored in the channel register 52 to specify a channel "3", only the analog signal on the input channel "CH3" is converted into a digital signal in the select mode. On the other hand, in the scan mode, all the input terminals are sequentially selected based on the channel specification data stored in the register 52, and the analog signal on the selected input terminal is converted into the digital signal. Therefore, in the above-mentioned conventional A/D conversion apparatus, a conversion cycle of each analog signal cannot be changed even if the conversion cycle of the A/D conversion is different in each analog signal. When the conversion cycle should be optionally changed, it is necessary to set the channel specification data in the above-mentioned register 52 again after the CPU accepts an interrupt. However, in this case, the A/D conversion is not carried out until new channel specification data is set. Considering a period to accept the interrupt and occupation of a bus by a DMA unit, an idling period of the A/D converter becomes irregular. Therefore, time scheduling is never achieved without using a circuit that operates constantly such as a timer. In addition, a limitation of allocation of channels and a load of software processing by the CPU are caused.

For this reason, a channel specification data shown in FIG. 3 has been used to set the input terminal of analog signal flexibly. Referring to FIG. 3, in the channel specification data, a start channel of the A/D conversion (input terminal) is specified with four lower bits. An end channel of the A/D conversion is specified with the four upper bits. The analog signals of the channels within the specified range can be converted into the digital signals by using such channel specification data depending on the conversion cycle.

However, even in the A/D conversion apparatus using such channel specification data, the next channel specification data cannot be set during the A/D conversion. Therefore, an A/D converter stops intermittently and it is not efficient as well as the conventional A/D conversion apparatus shown in FIG. 1. Also, it is impossible to select only a necessary channel because channels in a range are specified.

SUMMARY OF THE INVENTION

In an aspect of the present invention, an analog-to-digital conversion apparatus includes a register group, a selecting section and an A/D conversion section. The register group has a plurality of registers holding a plurality of channel specification data, respectively. The selecting section is connected with a plurality of analog channels, and sequentially selects the plurality of analog channels for analog-to-digital (A/D) conversion continuously without any idling time based on the plurality of channel specification data held by the plurality of registers. The A/D conversion section carries out the A/D conversion of an analog signal on each of the analog channels selected by the selecting section into a digital signal.

Here, each of the plurality of channel specification data may specify a single analog input channel. Also, each of the plurality of channel specification data may specify at least one analog input channel, and when the channel specification data specifies at least two analog input channels, the at least two analog input channels are independently specified. Instead, each of the plurality of channel specification data may specify two of the analog input channels, and one is an A/D conversion start channel and the other is an A/D conversion end channel. The A/D conversion is carried out to the analog signal on each of the analog input channels between the A/D conversion start channel and the A/D conversion end channel.

Also, it is preferable that the A/D conversion section issues a conversion end trigger signal immediately before end of the A/D conversion to a last analog input channel for each of the plurality of channel specification data. In this case, the plurality of channel specification data latched by the plurality of registers may be shifted between the plurality of registers in response to the conversion trigger signal. Especially, the plurality of channel specification data having latched by the plurality of registers are preferably circulated between the plurality of registers in response to the conversion trigger signal.

Also, the analog-to-digital conversion apparatus may further include a buffer in which the A/D conversion section stores a result of the A/D conversion; a memory; and a DMA unit configured to transfer the A/D conversion result stored in the buffer to the memory.

Also, the analog-to-digital conversion apparatus may further include a memory configured to store the channel specification data; and a DMA unit configured to read out new channel specification data from the memory and to set to a last one of the plurality of registers in response to the conversion trigger signal.

Also, the analog-to-digital conversion apparatus may further include a CPU configured to set the channel specification data to each of the plurality of registers and to issue a conversion instruction to the A/D conversion section such that the A/D conversion section carries out the A/D conversion.

Also, the analog-to-digital conversion apparatus may further include a CPU configured to set new channel specification data to a last one of the plurality of registers in response to the conversion trigger signal.

Also, the analog-to-digital conversion apparatus may further include a buffer in which the A/D conversion section stores a result of the A/D conversion; a bus; and a CPU configured to transfer the A/D conversion result stored in the buffer onto the bus.

In another aspect of the present invention, an analog-to-digital conversion method is achieved by making one of a plurality of channel specification data available; by selecting one of a plurality of analog channels for A/D conversion to be carried out based on the available channel specification data; by carrying out the A/D conversion of an analog signal on the selected analog channel into a digital signal; and by making a next one of the plurality of channel specification data available immediately before the A/D conversion for the available channel specification data ends.

Here, each of the plurality of channel specification data may specify a single analog input channel. Also, each of the plurality of channel specification data may specify at least one analog input channel, and when the channel specification data specifies at least two analog input channels, the at least two analog input channels are independently specified. Instead, each of the plurality of channel specification data may specify two of the analog input channels, and one is an A/D conversion start channel and the other is an A/D conversion end channel. The A/D conversion is carried out to the analog signal on each of the analog input channels between the A/D conversion start channel and the A/D conversion end channel.

Also, the carrying out the A/D conversion may be achieved by issuing a conversion end trigger signal immediately before end of the A/D conversion to a last analog input channel for the available channel specification data, and the making a next one may be achieved by making the next one of the plurality of channel specification data available in response to the conversion end trigger signal.

In another aspect of the present invention, an analog-to-digital conversion apparatus includes a register group, a selecting section and an A/D conversion section. The register group includes a plurality of registers holding a plurality of channel specification data, respectively. The selecting section is connected with a plurality of analog channels, and sequentially selects the plurality of analog channels for analog-to-digital (A/D) conversion continuously without any idling time based on the plurality of channel specification data held by the plurality of registers. The A/D conversion section carries out the A/D conversion of an analog signal on each of the analog channels selected by the selecting section into a digital signal, and to issue a conversion end trigger signal immediately before end of the A/D conversion to a last analog input channel for each of the plurality of channel specification data such that the available channel specification data is shifted among the plurality of channel specification data.

Here, each of the plurality of channel specification data may specify a single analog input channel. Also, each of the plurality of channel specification data may specify at least one analog input channel, and when the channel specification data specifies at least two analog input channels, the at least two analog input channels are independently specified. Instead, each of the plurality of channel specification data may specify two of the analog input channels, and one is an A/D conversion start channel and the other is an A/D conversion end channel. The A/D conversion is carried out to the analog signal on each of the analog input channels between the A/D conversion start channel and the A/D conversion end channel.

BRIEF DESCRIPTION OF THE DRAWINGS

FIG. 2 is a diagram showing a channel specification data used in the conventional A/D conversion apparatus;

FIG. 3 is a diagram showing another channel specification data;

FIG. 9 is a diagram showing an operation of the analog-to-digital conversion apparatus in the third embodiment of the present invention.

DESCRIPTION OF THE PREFERRED EMBODIMENTS

Hereinafter, an analog-to-digital (A/D) conversion apparatus of the present invention will be described in detail with reference to the attached drawings.

Figure 1:
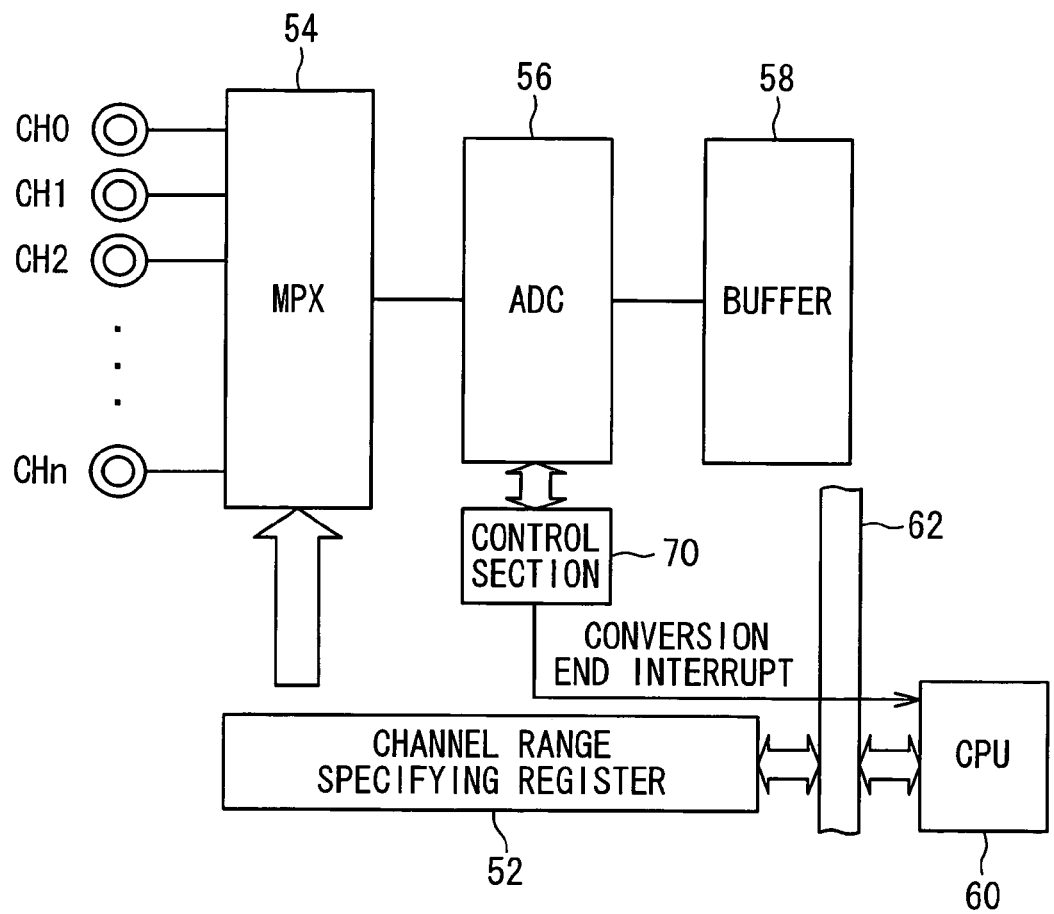
FIG. 1 is a block diagram showing a configuration of a conventional A/D conversion apparatus.
Figure 4:
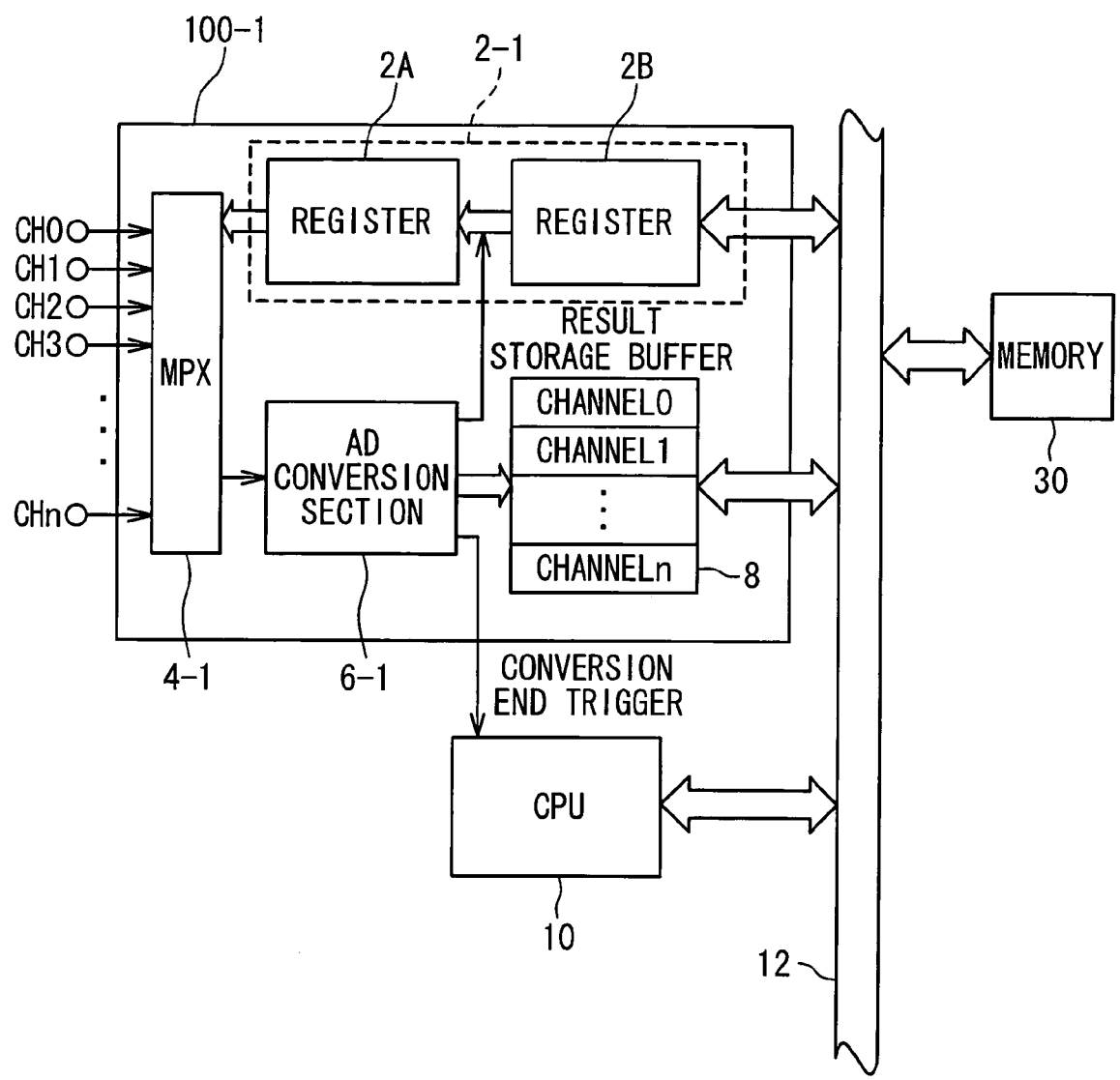
FIG. 4 is a block diagram showing a hardware configuration of an analog-to-digital conversion apparatus according to a first embodiment of the present invention.

FIG. 4 is a block diagram showing a hardware configuration of the A/D conversion apparatus according to the first embodiment of the present invention. Referring to FIG. 4, the A/D conversion apparatus in the first embodiment includes an A/D converter 100-1, a CPU 10, and a memory 30. The A/D converter 100-1, the CPU 10, and the memory 30 are connected by a bus 12. The A/D converter 100-1 includes a register group 2-1, a multiplexer 4-1 as a selecting unit, an A/D conversion section 6-1, and a buffer 8.

The register group 2-1 includes a plurality of registers 2A and 2B to respectively store channel specification data, and the registers 2A and 2B are connected in series. The register 2B is connected with the bus 12. In this example, the channel specification data is to specify one analog input channel. At an initial stage of the A/D conversion process, the registers 2A and 2B latch and hold the channel specification data in response to a latch signal from the CPU 10. Then, when the A/D conversion process is carried out, the channel specification data having latched in the register 2B is transferred to the register 2A in response to a conversion end trigger from the A/D conversion section 6-1. That is to say, the channel specification data in the register 2B is shifted to the register 2A in response to the conversion end trigger from the A/D conversion section 6-1. Immediately after that, the register 2B latches a new channel specification data through the bus 12 in response to a latch signal from the CPU 10.

A plurality of analog input channels CH1 to CHn are connected with the multiplexer 4-1. Each of the analog input channels supplies an analog signal to the multiplexer 4-1. The multiplexer 4-1 decodes the channel specification data latched in the register 2A, and selects one of the plurality of analog input channels based on the decoding result. The multiplexer 4-1 outputs the analog signal on the selected analog input channel to the A/D conversion section 6-1 together with data indicating the selected analog input channel.

The buffer 8 has a result storage region corresponding to each of the plurality of analog input channels CH1 to CHn. The A/D conversion section 6-1 converts the analog signal supplied from the multiplexer 4-1 into a digital signal within an A/D conversion period. Then, the A/D conversion section 6-1 stores the conversion result in the corresponding result storage region of the buffer 8 based on the selected channel indication data. Also, the A/D conversion section 6-1 generates the conversion end trigger immediately before the end of the A/D conversion period, and outputs the trigger to the register group 2-1 and the CPU 10.

At the initial stage of the A/D conversion process, the CPU 10 reads the channel specification data from the memory 30 to set the channel specification data in the registers 2A and 2B of the register group 2-1. Also, when receiving an A/D conversion instruction, the CPU 10 controls the A/D conversion section 6-1 to start the A/D conversion process. After the A/D conversion process starts, the CPU 10 reads out the channel specification data from the memory 30 to set the data in the register 2B of the register group 2-1 in response to the conversion end trigger from the A/D conversion section 6-1. Moreover, the CPU 10 reads out the digital signals stored in the result storage regions of the buffer 8 to store the read-out signals in the memory 30 through the bus 12.

Figure 5:
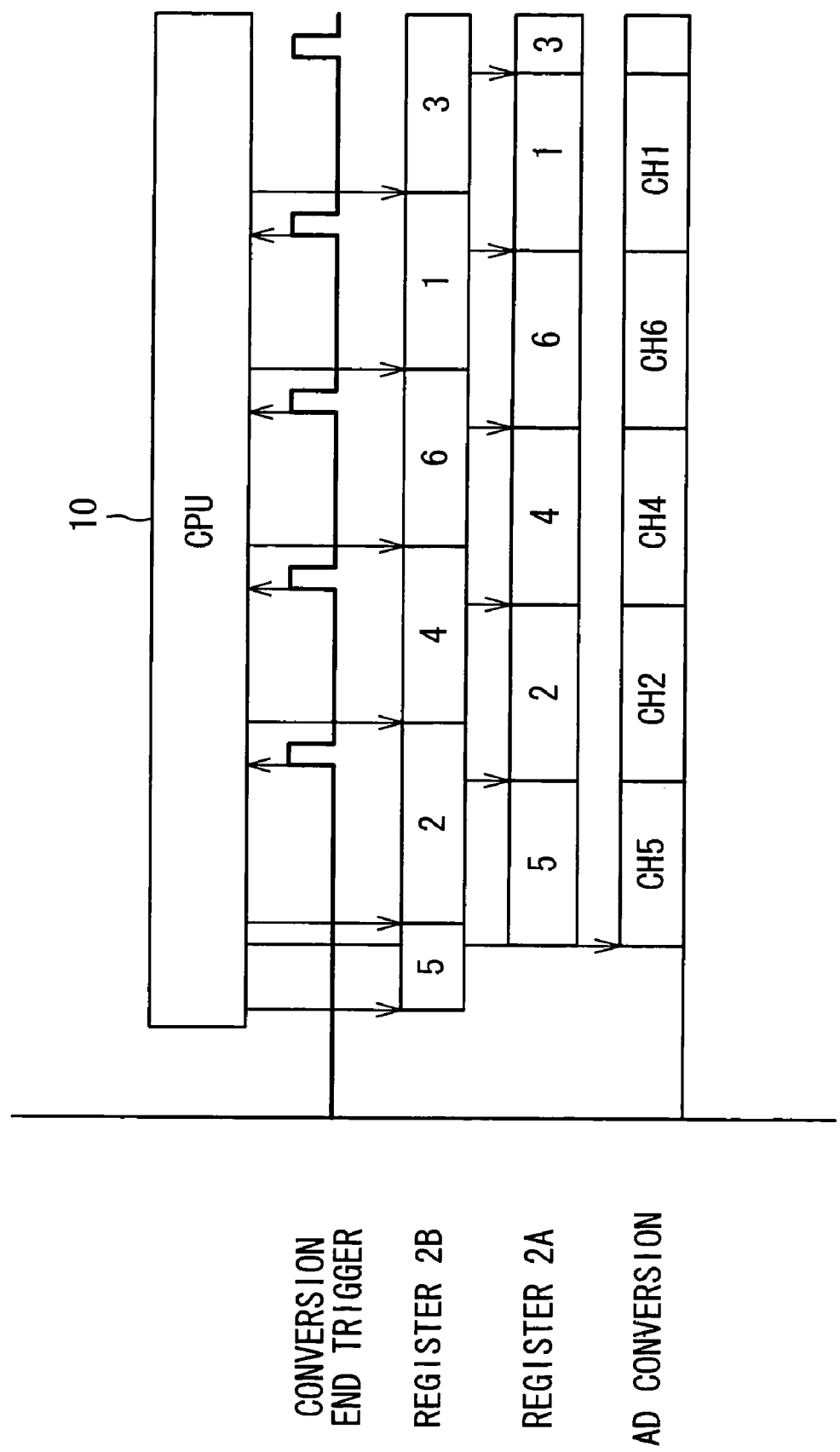
FIG. 5 is a diagram showing an operation of the analog-to-digital conversion apparatus in the first embodiment of the present invention.

Next, referring to FIG. 5, an operation of the A/D conversion apparatus in the first embodiment of the present invention will be described. In response to the A/D conversion instruction, the CPU 10 reads out a channel specification data "5" from the memory 30 onto the bus 12 at the initial stage of the A/D conversion process, and subsequently the CPU 10 outputs the latch signal to the register 2B in the register group 2-1. Thus, as shown, the channel specification data "5" is latched in the register 2B of the register group 2-1. Continuously, the CPU 10 outputs the latch signal to the register 2A of the register group 2-1. Thus, the channel specification data "5" becomes available. The register 2A latches the channel specification data "5" stored in the register 2B in response to the latch signal from the CPU 10. Further, the CPU 10 reads out a channel specification data "2" from the memory 30 onto the bus 12, and outputs the latch signal to the register 2B in the register group 2-1. Thus, the channel specification data "5" is held by the register 2A of the register group 2-1, and the channel specification data "2" is held by the register 2B. In this way, the initial process of the A/D conversion process is completed.

Next, the CPU 10 outputs a conversion start instruction to the AID conversion section 6-1. The A/D conversion section 6-1 starts the A/D conversion process in response to the conversion start signal. At this time, the analog signal on the analog input channel corresponding to the channel specification data "5" is selected and supplied to the A/D conversion section 6-1 by the multiplexer 4-1. The A/D conversion section 6-1 converts the analog signal supplied from the multiplexer 4-1 into a digital signal within the A/D conversion period. The obtained digital signal is stored in the result storage region of the buffer 8 corresponding to the selected channel based on the channel data outputted from the multiplexer 4-1.

At this time, the A/D conversion section 6-1 outputs the conversion end trigger to the register group 2-1 and the CPU 10 immediately before the end of the A/D conversion period. As shown, the register 2A of the register group 2-1 latches the channel specification data "2" having held by the register 2B in response to the conversion end trigger. Also, the CPU 10 reads out the next channel specification data "4" from the memory 30 in response to the conversion end trigger to supply the data to the register group 2-1 through the bus 12. The register 2B of the register group 21 latches the channel specification data "4" in response to the latch signal from the CPU 10. Subsequently, the CPU 10 reads out the stored digital signal from the buffer 8 and stores the digital signal in the memory 30 through the bus 12.

By repeating of the above-mentioned process, the channel specification data held in the register 2A is switched from "5", to "2", "4", "6", "1", and "3" for every A/D conversion period. The analog signal on the analog input channel specified by the channel specification data is converted into the digital signal by the A/D conversion section 6-1. The digital signal is stored in the result storage region of the buffer 8 corresponding to the selected channel. Then, the digital signal is stored in the memory 30.

As described above, in the A/D conversion apparatus in the first embodiment of the present invention, the conversion end trigger is outputted immediately before the end of the A/D conversion period of the A/D conversion section 6-1 for one channel specification data. In response to the conversion end trigger, the next channel specification data having held in the register 2B is latched by the register 2A, and the A/D conversion process is carried out. Thus, the A/D conversion process for the next channel specification data "2" can be carried out without any idling period after the A/D conversion process for the channel specification data "5".

Figure 6:
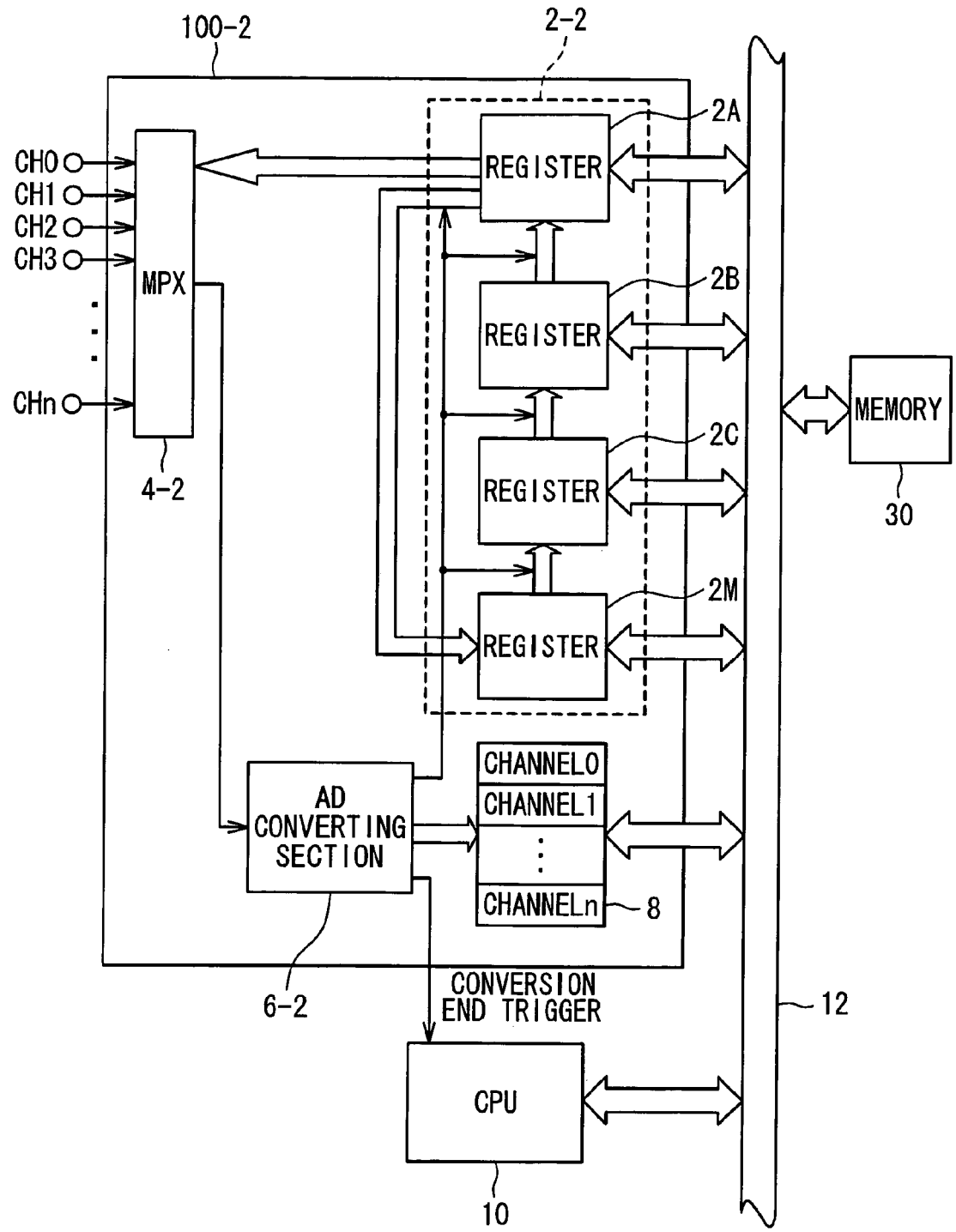
FIG. 6 is a block diagram showing a hardware configuration of the analog-to-digital conversion apparatus in a second embodiment of the present invention.

Next, the A/D conversion apparatus according to the second embodiment of the present invention will be described below with reference to the attached drawings. FIG. 6 is a block diagram showing a hardware configuration of the analog-to-digital conversion apparatus in the second embodiment of the present invention. Referring to FIG. 6, the A/D conversion apparatus in the second embodiment includes an A/D converter 100-2, a CPU 10, and a memory 30. The A/D converter 100-2, the CPU 10, and the memory 30 are connected with a bus 12. The A/D converter 100-2 includes a register group 2-2, a multiplexer 4-2 as a selecting unit, an A/D conversion section 6-2, and a buffer 8.

The register group 2-2 includes a plurality of registers 2A to 2M to store channel specification data, respectively, and they are connected in series. The plurality of registers 2A to 2M are also connected with the bus 12. In this example, the channel specification data specifies a channel range including at least one analog input channel, and an analog signal on each of channels in the channel range is converted to a digital signal. At an initial stage of the A/D conversion process, the registers 2A to 2M latch a plurality of channel specification data in response to latch signals from the CPU 10, respectively. Then, when the A/D conversion process is started, each register latches the channel specification data having held in the following register in response to a conversion end trigger from the A/D conversion section 6-2. The channel specification data having latched in the register 2A is latched by the register 2M arranged at the end of the line of the registers. That is, the channel specification data latched in the plurality of registers are circulated in response to the conversion end trigger from the A/D conversion section 6-2.

The plurality of analog input channels CH1 to CHn are connected with the multiplexer 4-2. Each analog input channel supplies an analog signal to the multiplexer 4-2. In the second embodiment, each channel specification data can specify a plurality of continuous analog input channels as the channel range. As shown in FIG. 3, the channel specification data includes data indicating an A/D conversion start channel, and data indicating an A/D conversion end channel. The multiplexer 4-2 includes a decode circuit (not shown) therein. The decode circuit decodes the channel specification data having latched in the register 2A. The decode circuit specifies the plurality of analog input channels from the A/D conversion start channel to the A/D conversion end channel sequentially every conversion cycle. The multiplexer 4-2 outputs to the A/D conversion section. 6-2, data indicating the analog input channel, which is currently selected in response to the specification of the analog input channel, and an analog signal on the selected analog input channel. In addition, the multiplexer 4-2 outputs to the A/D conversion section 6-2, data indicating whether the currently selected channel is the last analog input channel in the channel specification data latched in the register 2A.

The buffer 8 has result storage regions for the plurality of analog input channels CH1 to CHn. The A/D conversion section 6-2 converts the analog signal supplied from the multiplexer 4-2 into the digital signal within the A/D conversion period. Then, the A/D conversion section 6-1 stores the obtained digital signal in the result storage region of the buffer 8 based on the data indicating the selected analog input channel. Also, when receiving the data indicating that the selected channel is the last analog input channel, the A/D conversion section 6-2 generates the conversion end trigger immediately before the end of the A/D conversion period, and outputs the trigger to the register group 2-2 and the CPU 10.

At the initial stage of the A/D conversion process, the CPU 10 reads out the channel specification data from the memory 30 to store the data in the registers 2A to 2M of the register group 2-2. When the A/D conversion process is started, the CPU 10 reads out the digital signals stored in the result storage regions of the buffer 8 to store the digital signals in the memory 30 through the bus 12.

Figure 7:
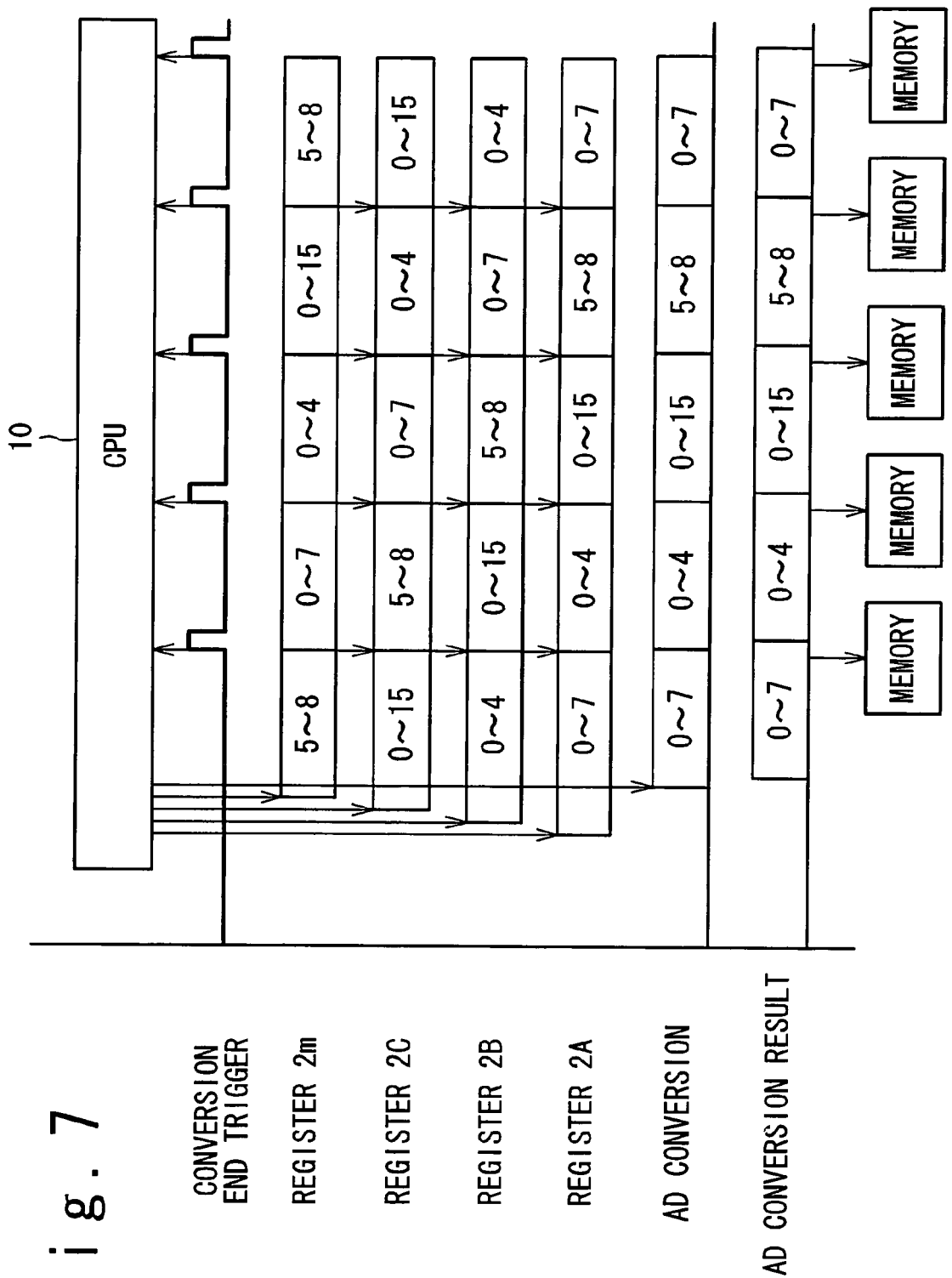
FIG. 7 is a diagram showing an operation of the analog-to-digital conversion apparatus in the second embodiment of the present invention.

Next, referring to FIG. 7, an operation of the A/D conversion apparatus in the second embodiment of the present invention will be described. In response to the A/D conversion instruction, the CPU 10 reads out channel specification data from "0 to 7", to "0 to 4", "0 to 15", . . . , "5 to 8" from the memory 30 to the bus 12 at the initial stage of the A/D conversion process. Subsequently, the CPU 10 outputs the latch signals to the registers 2A, 2B, . . . and 2M of the register group 2-2. Thus, as shown in FIGS. 7(*b*) to (*e*), the channel specification data are latched by the registers 2A to 2M in the register group 2-2. Thus, the initial stage of the A/D conversion process is finished.

Next, the CPU 10 outputs a conversion start instruction to the A/D conversion section 6-2. As shown in FIG. 7(*f*), the A/D conversion section 6-2 starts the A/D conversion process in response to the conversion start instruction. At this time, the multiplexer 4-1 decodes the channel specification data "0 to 7" to identify that the A/D conversion start channel is CH0, and the A/D conversion end channel is CH7. Thereafter, the multiplexer 4-2 selects the analog input channel CH0, and supplies the analog signal on the channel CH0 to the A/D conversion section 6-2 together with the data indicating the channel CH0. The A/D conversion section 6-2 converts the analog signal supplied from the multiplexer 4-2 into the digital signal within the A/D conversion period. The obtained digital signal is stored in the result storage region of the buffer 8 based on the data indicating the channel CH0.

It should be noted that the conversion end trigger is not outputted at this time in the second embodiment, unlike the first embodiment. Subsequently, the multiplexer 4-2 selects the analog input channel CH1, and supplies the analog signal on the channel CH1 to the A/D conversion section 6-2 together with the data indicating the channel CH1. The A/D conversion section 6-2 converts the analog signal supplied from the multiplexer 4-2 into the digital signal within the A/D conversion period. The obtained digital signal is stored in the result storage region of the buffer 8 based on the data indicating the channel CH1. The similar process is repeated to the analog input channel CH6.

Next, when the analog input channel CH7 is selected, the multiplexer 4-2 outputs the analog signal on the channel CH7 to the A/D conversion section 6-2, together with the data indicating the channel CH7 and the data that the channel CH7 is the A/D conversion end channel. The A/D conversion section 6-2 converts the analog signal supplied from the multiplexer 4-2 into the digital signal in the A/D conversion period. The obtained digital signal is stored in the result storage region of the buffer 8 based on the data indicating the channel CH7.

As shown in FIG. 7(*a*), the A/D conversion section 6-2 outputs the conversion end trigger to the register group 2-2 and the CPU 10 immediately before the end of the A/D conversion period for the channel CH7 in response to the data that the channel CH7 is the A/D conversion end channel. As shown in FIGS. 7(*c*) to (*e*), the registers 2A to 2L in the register group 2-2 latches the channel specification data having latched in the registers 2B to 2M in response to the conversion end trigger. Also, the register 2M latches the channel specification data having latched in the register 2A. Thus, the channel specification data latched in the register group 2-2 are circulated. Moreover, the CPU 10 reads out the stored digital signals from the buffer 8 to store the read-out signals in the memory 30 through the bus 12.

By repeating the above-mentioned process, the analog signals supplied to the A/D conversion section 6-2 are changed from "0" to "1", "2", "3", "4", . . . , "7" in order for every A/D conversion period to each channel specified based on the channel specification data. The analog signal from the multiplexer 4-2 is converted into the digital signal by the A/D conversion section 6-2, and the obtained digital signal is stored in the result storage region of the buffer 8 corresponding to the selected channel. Thereafter, when the A/D conversion process for one channel specification data is ended, the conversion end trigger is outputted, and the A/D conversion process is started for the following channel specification data. That is, the CPU issues the conversion start instruction to the A/D conversion section 6-2 for the next channel specification data.

As described above, in the A/D conversion apparatus in the second embodiment of the present invention, the conversion end trigger is outputted immediately before the end of the A/D conversion period for one channel specification data by the A/D conversion section 6-2. The conversion end trigger is never outputted when the A/D conversion of the analog signal on each of channels specified based on the channel specification data other than the last channel is ended. In response to the conversion end trigger, each register in the register group 2-2 latches the channel specification data having latched in the following register. The channel specification data having latched in the register 2A is latched in the register 2M in the last register of a series of registers. That is, the channel specification data which have been latched by the plurality of registers, are shifted or circulated in response to the conversion end trigger from the A/D conversion section 6-2. Thus, the A/D conversion process can be continuously carried out. Moreover, by setting the channel specification data in the register group 2-2 according to the A/D conversion cycle, the digital signals can be obtained at proper timings without losing the timing of each analog signal. In the second embodiment, the number of needed registers can be decreased because each channel specification data can specify a range of the channels associated with the analog signals to be converted into the digital signals.

Figure 8:
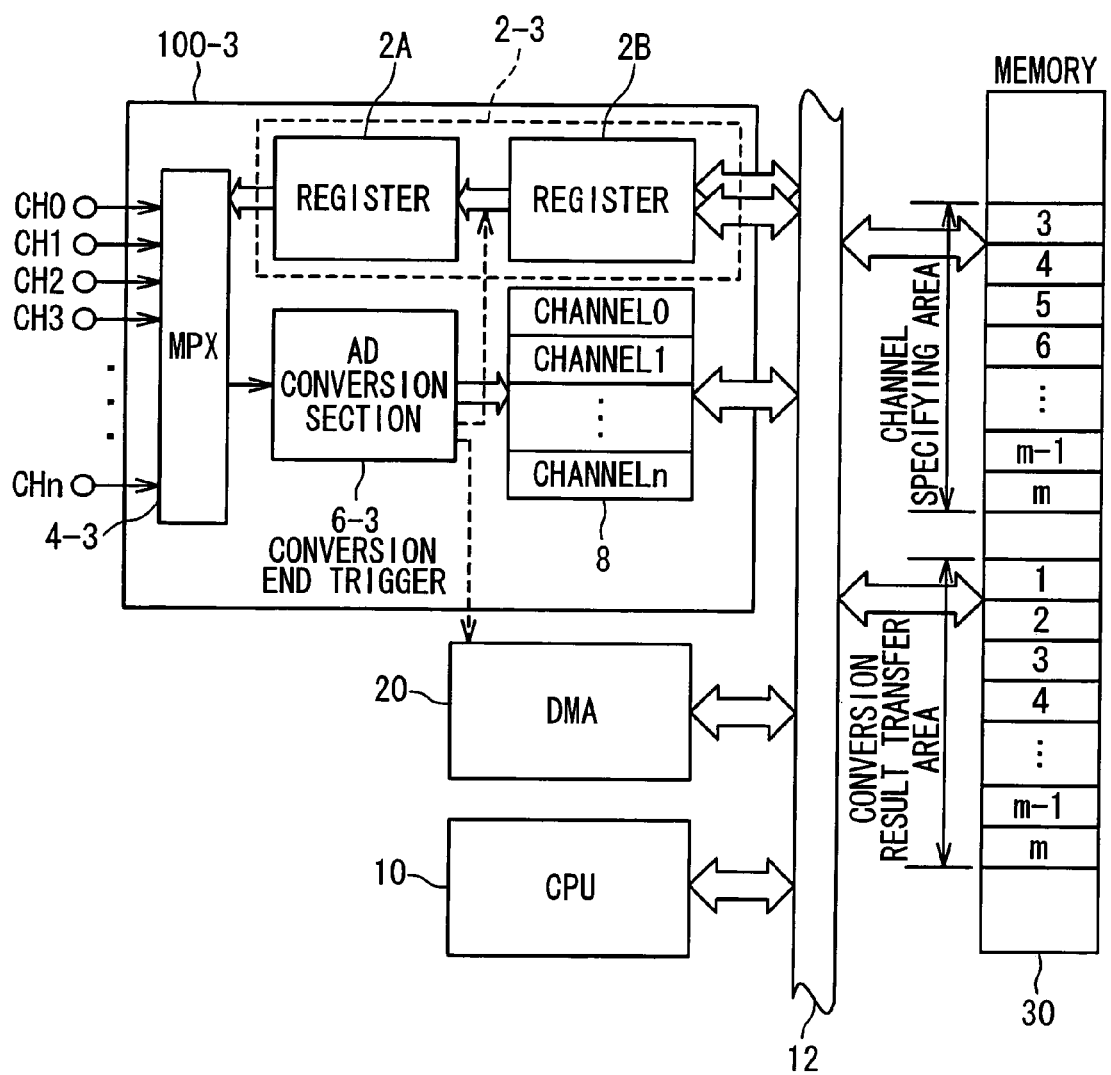
FIG. 8 is a block diagram showing a hardware configuration of the analog-to-digital conversion apparatus in a third embodiment of the present invention.

Next, the A/D conversion apparatus according to the third embodiment of the present invention will be described below with reference to the attached drawings. FIG. 8 is a block diagram showing a hardware configuration of the A/D conversion apparatus in the third embodiment of the present invention. Referring to FIG. 8, the A/D conversion apparatus in the third embodiment includes an A/D converter 100-3, a CPU 10, a DMA unit 20 and a memory 30. The A/D converter 100-3, the CPU 10, the DMA unit 20 and the memory 30 are connected with a bus 12. The A/D converter 100-3 includes a register group 2-3, a multiplexer 4-3 as a selecting unit, an A/D conversion section 6-3, and a buffer 8.

The register group 2-3 includes a plurality of registers 2A and 2B to store the channel specification data, respectively, and the registers 2a and 2B are connected in series. The configuration of the register group 2-3 is the same as the register group 2-1 in the first embodiment. That is, the register 2B is connected with the bus 12. In this example, the channel specification data is data that can specify at least one analog input channel independently. At an initial stage of the A/D conversion process, the registers 2A and 2B latch the channel specification data in response to latch signals from the CPU 10. Then, in response to the start of the A/D conversion process, the register 2A latches the channel specification data having latched in the register 2B in response to a conversion end trigger from the A/D conversion section 6-3. That is, the channel specification data having latched in the register 2B is shifted to the register 2A in response to the conversion end trigger from the A/D conversion section 6-3. Immediately after the shift, the DMA unit 20 reads out the channel specification data from the memory 30 and sets the read-out data in the register 2B.

A plurality of analog input channels CH1 to CHn are connected with the multiplexer 4-3. Each analog input channel supplies an analog signal to the multiplexer 4-3. The multiplexer 4-3 decodes the channel specification data latched in the register 2A, and sequentially outputs the analog signals on the analog input channels, which are specified based on the channel specification data, to the A/D conversion section 6-3 based on the decode result. At this time, the data indicating the selected analog input channel is also outputted. When the channel specified based on channel specification data indicates the last analog input channel, the multiplexer 4-3 outputs to the A/D conversion section 6-3, the data indicating that the channel is the last analog input channel.

The buffer 8 has a result storage region corresponding to each of the plurality of analog input channels CH1 to CHn. The A/D conversion section 6-3 converts the analog signal supplied from the multiplexer 4-3 into the digital signal within the A/D conversion period. Then, the A/D conversion section 6-3 stores the obtained digital signal in the storage region of the buffer 8 based on the data indicating the selected analog input channel supplied from the multiplexer 4-3. When the A/D conversion section 6-3 does not receive the data indicating the last analog input channel, the A/D conversion section 6-3 does not output the conversion end trigger even at the end of the A/D conversion period. On the other hand, when the A/D conversion section 6-3 receives the data indicating the last analog input channel, the A/D conversion section 6-3 converts the analog signal supplied from the multiplexer 4-3 into the digital signal, and stores the obtained digital signal in the result storage region of the buffer 8 based on the data indicating the selected analog input channel. In addition, the A/D conversion section 6-3 generates the conversion end trigger immediately before the end of the A/D conversion period, and outputs the trigger to the register group 2-3 and the DMA unit 20.

At the initial stage of the A/D conversion process, the CPU 10 reads out the channel specification data from the memory 30 to store the data in the registers 2A and 2B of the register group 2-3. When the A/D conversion process is started, the DMA unit 20 reads out the channel specification data from the memory 30 in response to the conversion end trigger from the A/D conversion section 6-3, to store the data in the register 2B of the register group 2-3. Also, the DMA unit 20 reads out the digital signals stored in the result storage regions of the buffer 8 and to store the digital signals in the memory 30 through the bus 12.

Next, referring to FIG. 9, an operation of the A/D conversion apparatus in the third embodiment of the present invention will be described. When receiving the A/D conversion instruction, the CPU 10 reads out a channel specification data "1,5" from the memory 30 onto the bus 12 at the initial stage of the A/D conversion process, and the CPU 10 outputs the latch signal to the register 2B of the register group 2-3. Thus, as shown in FIG. 9(*b*), the channel specification data "1,5" is latched by the register 2B of the register group 2-3. Next, the CPU 10 outputs the latch signal to the register 2A of the register group 2-3. In response to the latch signal from the CPU 10, the register 2A latches the channel specification data "1,5" having latched in the register 2B. Further, the CPU 10 reads out a channel specification data "1,3,5,7" from the memory 30 onto the bus 12, and outputs the latch signal to the register 2B of the register group 2-3. Thus, as shown in FIGS. 9(*b*) and (*c*), the channel specification data "1,5" is latched by the register 2A of the register group 2-3, and the channel specification data "1,3,5,7" is latched by the register 2B. In this way, the initial stage of the A/D conversion process is ended.

Next, the CPU 10 outputs a conversion start instruction to the A/D conversion section 6-3. As shown in FIG. 9(*d*), the A/D conversion section 6-3 starts the A/D conversion process in response to the conversion start signal. At this time, the multiplexer 4-3 selects the channel corresponding to the data "1" of the channel specification data "1,5" and supplies the analog signal on the selected channel to the A/D conversion section 6-3. The A/D conversion section 6-3 converts the analog signal supplied from the multiplexer 4-3 into a digital signal within the A/D conversion period. The obtained digital signal is stored in the result storage region of the buffer 8 based on the data indicating the selected analog input channel CH1 from the multiplexer 4-3.

At this time, the analog input channel CH1 is not the last analog input channel of the channel specification data "1,5". Therefore, the A/D conversion section 6-3 does not output the conversion end trigger. Subsequently, the multiplexer 4-3 outputs to the A/D conversion section 6-3, the data indicating the analog input channel CH5, data indicating that the channel CH5 is the last analog input channel, and an analog signal on the selected analog input channel CH5. The A/D conversion section 6-3 converts the analog signal supplied from the multiplexer 4-3 into a digital signal within the A/D conversion period. The obtained digital signal is stored in the result storage region of the buffer 8 based on the data indicating the analog input channel CH5. At this time, as shown in FIG. 9(a), the A/D conversion section 63 outputs the conversion end trigger to the register group 2-3 and the DMA unit 20 based on the data indicating the last analog input channel, immediately before the end of the A/D conversion period for the analog signal on the selected analog input channel CH5. Then, as shown in FIG. 9(c), the register 2A of the register group 2 latches the channel specification data "1, 3, 5, 7" having latched by the register 2B in response to the conversion end trigger. Also, the DMA unit 20 reads out the following channel specification data "1, 4, 6, 9, 11" from the memory 30 in response to the conversion end trigger, and stores the read-out data in the register 2B of the register group 2-3 through the bus 12. Thus, as shown in FIG. 9(b), the register 2B of the register group 2-3 latches the channel specification data "1, 4, 6, 9, 11" in response to the conversion end trigger. Subsequently, the DMA unit 20 reads out the stored digital signals from the buffer 8 and stores the signals in the memory 30 through the bus 12.

By repeating the above-mentioned process, the channel specification data latched in the register 2A is changed from "1,5" to "1,3,5,7", . . . The analog signal on the channel specified based on the channel specification data is converted into the digital signal by the A/D conversion section 6-3. The obtained digital signal is stored in the result storage region of the buffer 8. Thereafter, the digital signals are stored in the memory 30.

As mentioned above, in the A/D conversion apparatus in the third embodiment of the present invention, the conversion end trigger is outputted immediately before the end of the A/D conversion period for one channel specification data by the A/D conversion section 6-3. In response to the conversion end trigger, the next channel specification data having been latched by the register 2B is latched by the register 2A. Thus, the A/D conversion process is carried out. In this way, the A/D conversion process to the next channel specification data can be carried out without any idling period after the end of the A/D conversion process to the channel specification data.

In the third embodiment, transmissions of the channel specification data and the conversion result are carried out by the DMA unit. However, in the first and second embodiments, the DMA unit may be used in the same manner as the third embodiment. Moreover, the decoding operation and the data output by the multiplexer 4-2 and 4-3, and the addressing for the buffer 8 by the A/D conversion units 6-1, 6-2, and 6-3 may be carried out by another control unit installed additionally.

It should be noted that the above first to the third embodiments may be combined, as long as contradiction is not caused.

According to the present invention, the A/D conversion can be carried out continuously for a plurality of channel specification data without any stop. Also, the A/D conversion can be carried out in conversion cycle suitable to the analog signals with a different A/D conversion cycle. Also, the software load can be reduced in the A/D conversion process and a storage process of the A/D conversion result.

In addition, the reduction in chip size and the decrease of power consumption can be achieved through the reduction in the number of the A/D converters to be installed.

What is claimed is:

1. An analog-to-digital conversion apparatus, comprising:
   a register group comprising a plurality of registers holding a plurality of channel specification data, respectively;
   a selecting section connected with a plurality of analog channels, and configured to sequentially select said plurality of analog channels for analog-to-digital (A/D) conversion continuously without any idling time based on said plurality of channel specification data held by said plurality of registers; and
   an A/D conversion section configured to carry out the A/D conversion of an analog signal on each of said analog channels selected by said selecting section into a digital signal,
   wherein said A/D conversion section issues a conversion end trigger signal immediately before end of said A/D conversion to a last analog input channel for each of said plurality of channel specification data, and
   wherein said plurality of channel specification data, having been latched by said plurality of registers, are shifted between said plurality of registers in response to said conversion trigger signal.

2. The analog-to-digital conversion apparatus according to claim 1, wherein each of said plurality of channel specification data specifies a single analog input channel.

3. The analog-to-digital conversion apparatus according to claim 1, wherein each of said plurality of channel specification data specifies at least one analog input channel, and when said channel specification data specifies at least two analog input channels, the at least two analog input channels are independently specified.

4. The analog-to-digital conversion apparatus according to claim 1, wherein said plurality of channel specification data having latched by said plurality of registers are circulated between said plurality of registers in response to said conversion trigger signal.

5. The analog-to-digital conversion apparatus according to claim 1, further comprising:
   a buffer in which said A/D conversion section stores a result of said A/D conversion;
   a memory; and
   a Direct Memory Access unit configured to transfer said A/D conversion result stored in said buffer to said memory.

6. The analog-to-digital conversion apparatus according to claim 1, further comprising:
   a central processing unit configured to set said channel specification data to each of said plurality of registers and to issue a conversion instruction to said A/D conversion section such that said A/D conversion section carries out said A/D conversion.

7. The analog-to-digital conversion apparatus according to claim 1, further comprising:
   a buffer in which said A/D conversion section stores a result of said A/D conversion;
   a bus; and
   a central processing unit configured to transfer said A/D conversion result stored in said buffer onto said bus.

8. An analog-to-digital conversion apparatus, comprising:
   a register group comprising a plurality of registers holding a plurality of channel specification data, respectively;
   a selecting section connected with a plurality of analog channels, and configured to sequentially select said plurality of analog channels for analog-to-digital (A/D)

conversion continuously without any idling time based on said plurality of channel specification data held by said plurality of registers;

an A/D conversion section configured to carry out the A/D conversion of an analog signal on each of said analog channels selected by said selecting section into a digital signal, wherein said A/D conversion section issues a conversion end trigger signal immediately before end of said A/D conversion to a last analog input channel for each of said plurality of channel specification data;

a memory configured to store said channel specification data; and a Direct Memory Access unit configured to read out new channel specification data from said memory and to set to a last one of said plurality of registers in response to said conversion trigger signal.

9. The analog-to-digital conversion apparatus according to claim 8, wherein each of said plurality of channel specification data specifies a single analog input channel.

10. The analog-to-digital conversion apparatus according to claim 8, wherein each of said plurality of channel specification data specifies at least one analog input channel, and when said channel specification data specifies at least two analog input channels, the at least two analog input channels are independently specified.

11. The analog-to-digital conversion apparatus according to claim 8, further comprising:
a buffer in which said A/D conversion section stores a result of said A/D conversion;
a memory; and
a Direct Memory Access unit configured to transfer said A/D conversion result stored in said buffer to said memory.

12. The analog-to-digital conversion apparatus according to claim 8, further comprising:
a central processing unit configured to set said channel specification data to each of said plurality of registers and to issue a conversion instruction to said A/D conversion section such that said A/D conversion section carries out said A/D conversion.

13. The analog-to-digital conversion apparatus according to claim 8, further comprising:
a buffer in which said A/D conversion section stores a result of said A/D conversion;
a bus; and
a central processing unit configured to transfer said A/D conversion result stored in said buffer onto said bus.

14. An analog-to-digital conversion apparatus, comprising:
a register group comprising a plurality of registers holding a plurality of channel specification data, respectively;
a selecting section connected with a plurality of analog channels, and configured to sequentially select said plurality of analog channels for analog-to-digital (A/D) conversion continuously without any idling time based on said plurality of channel specification data held by said plurality of registers;
an A/D conversion section configured to carry out the A/D conversion of an analog signal on each of said analog channels selected by said selecting section into a digital signal;
a central processing unit configured to set new channel specification data to a last one of said plurality of registers in response to a conversion trigger signal;
a buffer in which said A/D conversion section stores a result of said A/D conversion;
a memory; and
a Direct Memory Access unit configured to transfer said A/D conversion result stored in said buffer to said memory.

15. The analog-to-digital conversion apparatus according to claim 14, wherein each of said plurality of channel specification data specifies a single analog input channel.

16. The analog-to-digital conversion apparatus according to claim 14, wherein each of said plurality of channel specification data specifies at least one analog input channel, and when said channel specification data specifies at least two analog input channels, the at least two analog input channels are independently specified.

17. The analog-to-digital conversion apparatus according to claim 14, further comprising:
a central processing unit configured to set said channel specification data to each of said plurality of registers and to issue a conversion instruction to said A/D conversion section such that said A/D conversion section carries out said A/D conversion.

18. The analog-to-digital conversion apparatus according to claim 14, further comprising:
a bus; and
a central processing unit configured to transfer said A/D conversion result stored in said buffer onto said bus.

19. An analog-to-digital conversion method, comprising:
making one of a plurality of channel specification data available;
selecting one of a plurality of analog channels for A/D conversion to be carried out based on said available channel specification data;
carrying out said A/D conversion of an analog signal on the selected analog channel into a digital signal; and
making a next one of said plurality of channel specification data available immediately before said A/D conversion for said available channel specification data ends,
wherein each of said plurality of channel specification data specifies two of said analog input channels, and one is an A/D conversion start channel and the other is an A/D conversion end channel, and
said A/D conversion is carried out to said analog signal on each of said analog input channels between said A/D conversion start channel and said A/D conversion end channel, wherein said carrying out said A/D conversion comprises:
issuing a conversion end trigger signal immediately before end of said A/D conversion to a last analog input channel for said available channel specification data, and
said making a next one comprises:
making said next one of said plurality of channel specification data available in response to said conversion end trigger signal.

20. An analog-to-digital conversion apparatus comprising:
a register group having a plurality of registers holding a plurality of channel specification data, respectively;
a selecting section connected with a plurality of analog channels, and configured to sequentially select said plurality of analog channels for analog-to-digital (A/D) conversion continuously without any idling time based on said plurality of channel specification data held by said plurality of registers; and
an A/D conversion section configured to carry out the A/D conversion of an analog signal on each of said analog channels selected by said selecting section into a digital signal, and to issue a conversion end trigger signal immediately before end of said A/D conversion to a last analog input channel for each of said plurality of channel specification data such that said available channel specification data is shifted among said plurality of channel specification data, wherein each of said plurality of channel specification data specifies two of said analog input channels, and one is an A/D conversion start channel and the other is an A/D conversion end channel, and said A/D conversion is carried out to said analog signal on each of said analog input channels between said A/D conversion start channel and said A/D conversion end channel.

* * * * *